US007855614B2

United States Patent
Van Quach et al.

(10) Patent No.: US 7,855,614 B2
(45) Date of Patent: Dec. 21, 2010

(54) INTEGRATED CIRCUIT TRANSMISSION LINES, METHODS FOR DESIGNING INTEGRATED CIRCUITS USING THE SAME AND METHODS TO IMPROVE RETURN LOSS

(75) Inventors: Minh Van Quach, San Jose, CA (US); Nurwati S. Devnani, Fort Collins, CO (US); Wang Lin, Singapore (SG); Hyacinth Tok, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 201 days.

(21) Appl. No.: 12/122,426

(22) Filed: May 16, 2008

(65) Prior Publication Data

US 2009/0284324 A1     Nov. 19, 2009

(51) Int. Cl.
*H03H 7/38* (2006.01)
(52) U.S. Cl. .................................................. 333/34

(58) Field of Classification Search .................. 333/33, 333/34, 238, 1, 246; 326/30
See application file for complete search history.

(56) References Cited

U.S. PATENT DOCUMENTS

| 6,737,932 | B2 * | 5/2004 | Killen et al. ............... 333/35 |
| 7,088,200 | B2 * | 8/2006 | Bartley et al. .............. 333/34 |

* cited by examiner

*Primary Examiner*—Stephen E Jones

(57) ABSTRACT

Integrated circuit transmission lines are designed to match elements at opposing ends of the transmission line over a frequency range of interest. By modifying characteristics of the transmission line over the length of the transmission line, from a first end coupled to a first external element to a second end coupled to a second external element, return loss is improved. In various embodiments one or more of the width of the conductors and the distance between adjacent edges of the conductors are modified across the length of the transmission line. In an alternative embodiment, the conductors of the transmission line are segmented with each segment having a length and a width across the segment.

13 Claims, 12 Drawing Sheets

INTEGRATED CIRCUIT TRANSMISSION LINES, METHODS FOR DESIGNING INTEGRATED CIRCUITS USING THE SAME AND METHODS TO IMPROVE RETURN LOSS

BACKGROUND

Transmission lines in conventional integrated circuit packages are designed to match a desired impedance level, generally identified by a resistive value. For example, integrated circuits have been produced with transmission lines having impedance values that range from tens of Ohms to about a hundred Ohms depending on application specific needs to match circuits and devices that are not part of the integrated circuit.

A transmission line is a pair of parallel conductors exhibiting certain characteristics due to distributed capacitance and inductance along the length of the transmission line. Every transmission line possesses a characteristic impedance, usually designated as $Z_0$. $Z_0$ is the ratio of electrical potential, E, to current, I, at every point along the transmission line. If a load equal to the characteristic impedance is placed at the output end of any length of a transmission line, the same impedance will appear at the input terminals of the line. The characteristic impedance determines the amount of current that can flow when a given voltage is applied to an infinitely long transmission line. Even though characteristic impedance is quantified by a measure of electrical resistance in Ohms, the characteristic impedance of a transmission line is entirely different from the leakage resistance of the dielectric separating the two conductors and the metallic resistance of the wires themselves. Characteristic impedance is a function of the capacitance and inductance distributed along the line's length. Thus, characteristic impedance would exist even if the dielectric was perfect and the metal used in the transmission lines had no series resistance.

It is desirable to match the characteristic impedance of transmission lines to other circuits, elements and external devices because the most efficient transfer of electrical energy takes place when the characteristic impedance of a first circuit, element or external device matches the characteristic impedance of the transmission line. When the characteristic impedance of the transmission line matches the impedance of a coupled circuit, element, or external device, energy will traverse the interface without reflection. Thus, no signal power will be lost.

An example simplified metallization layer of an integrated circuit with conventional transmission lines is illustrated in FIG. 1. The arrangement in FIG. 1 is a top plan view that illustrates the relative locations of four conductors along a portion of a metallization layer 10. The metallization layer 10 includes a left-side ground (AGND) conductor 12 and a right-side ground (AGND) conductor 14 along with a transmission line 13 and a transmission line 15. The transmission line 13 and the transmission line 15 each have characteristic impedances of 100 Ohms. That is, a circuit, element, or external device coupled to the transmission line 13 or the transmission line 15 will encounter a resistance of 100 Ohms.

Microwave theory indicates that varying the physical dimensions of a transmission line along its length will vary the characteristic impedance along the transmission line. However, the transmission line must have a length that is an integer multiple of ¼ the wavelength of the signal frequency and must be coupled to a fixed load. Both conditions, for reasons explained in greater detail below, are not present when communicating high frequency signals in an integrated circuit coupled to a load with varying impedance.

The implementation of a transmission line, such as the transmission line 13 and the transmission line 15 introduces a number of challenges. First, load impedances are not constant over frequency and temperature. Nearly all loads can be modeled as a resistor-capacitor (RC) network or a circuit of resistors and capacitors. The resistance value of a resistor varies with temperature. Similarly, the capacitance value of a capacitor varies with frequency. Consequently, when a transmission line is intended to match a desired impedance, signal return loss will vary with environment and circuit conditions. Return loss suffers significantly when the transmission line 13 or the transmission line 15 carry a high-frequency signal as the actual impedance will be lower than the desired impedance.

Furthermore, transmission lines implemented in an integrated circuit are not infinite in length. Not only are the transmission lines in an integrated circuit finite in length, but signals up to about 10 GHz will generally not have a length that is an integer multiple of a quarter of the wavelength of the signal. For example, a 1 GHz signal has a wavelength of 30 centimeters. Whereas a 10 GHz signal has a wavelength of 3.0 centimeters. The length of an integrated circuit transmission line will rarely be a multiple of ¼ of 3.0 centimeters. Accordingly, for at least these reasons, the transmission line itself will be responsible for some return loss due to reflections caused by the length of the transmission line.

Moreover, the various sets of conductors forming the multiple transmission lines in an integrated circuit will vary in length from transmission line to transmission line as not every path through the integrated circuit will have a similar length.

With the development of increasingly faster integrated circuits there is a corresponding increase in the demands made upon integrated circuits and integrated circuit assemblies for efficiency and frequency response. For example, the Commission Electrotechnique Internationale (CEI or International Electrotechnical Commission) has published a specification for return loss over frequency that limits the magnitude of acceptable return loss for integrated circuits, sub-assemblies and completed devices in which the circuits are used.

The plots of FIG. 2 and FIG. 3 reveal example time domain reflectometry data and return loss data, respectively for two example combinations. FIG. 2 illustrates the time-domain reflectometry (TDR) data for a first combination of a printed-circuit board and a conventional 100 Ohm package, as well as a second combination of a die, a printed-circuit board and a 100 Ohm transmission line. The plot shows time in nanoseconds (ns) from a reference time of 0.0 nanoseconds at the left most side of the plot to 0.8 nanosecond at the right most side of the plot vs. impedance in Ohms over a range of 80 to 100 moving up the plot.

As indicated by the trace 20 the first combination of the printed circuit board and the conventional 100 Ohm package has a TDR of approximately 100 Ohms from 0.0 nanoseconds to nearly 0.225 nanoseconds. From approximately 0.225 nanoseconds to about 0.375 nanoseconds, the TDR falls to a local minimum of approximately 87 Ohms. Thereafter, from between approximately 0.375 nanoseconds and 0.550 nanoseconds, the TDR rises until the TDR reaches about 100 Ohms. From about 0.550 nanoseconds to approximately 1.0 nanosecond, the TDR falls steadily about 2 to 3 Ohms from about 100 Ohms to about 97 Ohms. The trace 24, representing the second combination of the die, the printed-circuit board and the 100 Ohm transmission line, follows the trace 20 until just after 0.4 nanoseconds, where a local maximum value of about 90 Ohms is reached at approximately 0.45 nanoseconds. From the local maximum at about 0.45 nanoseconds the TDR falls until a second minimum value of about 82 Ohms is reached at approximately 0.575 nanoseconds. From 0.575 nanoseconds to about 0.8 nanoseconds the TDR rises from the local minimum of about 82 Ohms to about 96 Ohms. The TDR for the second combination remains at approximately 96 Ohms from about 0.8 nanoseconds to 1.0 nanosecond.

FIG. 3 illustrates the return loss in decibels (dB) vs. frequency in gigahertz (GHz) for the first combination (printed-circuit board and a conventional 100 Ohm package) and the second combination (the die, the printed-circuit board and the conventional 100 Ohm transmission line). Trace 30 represents a specified or minimum return loss as published by the CEI. As shown by trace 34, return loss increases from about −45 dB at 0 GHz to about −15 dB at 1.4 GHz. Thereafter, the return loss falls from the local maximum of about −15 dB to about −30 dB at approximately 2.4 GHz. From the local minimum at approximately 2.4 GHz, the return loss increases until about 4.75 GHz. From just under the local maximum level at 4.75 GHz to about 5.2 GHz, the return loss overlaps the specified return loss. That is, the return loss is out of specification for signals of about 4.75 GHz to about 5.2 GHz.

There are 3 possible ways to improve an impedance mismatch, all of which are called "impedance matching." The first way to improve an impedance mismatch is to present an apparent load to the source of $R_{load}=R_{source}*$ (complex conjugate matching). The second way to improve an impedance mismatch is to present an apparent load of $R_{load}=R_{line}$ (complex impedance matching), to avoid echoes. Given a transmission line source with fixed-source impedance, this "reflectionless" impedance matching at the end of the transmission line is a possible way to avoid reflecting echoes back to the transmission line. The third way to improve an impedance mismatch uses devices intended to present an apparent source resistance as close to zero as possible, or presents an apparent source voltage that is as high in magnitude as possible.

Transformers and combinations of resistors, inductors and capacitors have been used to match electrical impedances. These impedance matching devices are optimized for different applications, and are called baluns, antenna tuners, acoustic horns, matching networks, and terminators.

Transformers can match the impedances of circuits with different impedances. A transformer converts alternating current at one voltage to the same waveform at another voltage. The power input to the transformer and output from the transformer is the same absent conversion losses in the transformer. The winding with the lower voltage is at low impedance, because this winding has the lower number of turns, and the winding with the higher voltage is at a higher impedance as it has more turns in its coil. Resistive impedance matches are easiest to design and are used to transfer low-power signals, such as unamplified audio or radio-frequency signals in a radio receiver. Almost all digital circuits use resistive impedance matching which is usually built into the structure of the switching element.

Transformers and combinations of resistors, inductors and capacitors, if used to match the impedance of transmission lines in an integrated circuit, would require additional circuit area and additional power. Therefore, it would be desirable to reduce return loss such that integrated circuits and printed circuit board combinations, as well as integrated circuit assemblies that include a combination of an integrated circuit, a printed circuit board and a die could exceed a specified return loss over a broader range of operating frequencies absent transformers and additional circuitry.

SUMMARY

An embodiment of a transmission line includes a pair of adjacent conductors in an integrated circuit having a first end and a second end. The first end has a first impedance that approximates the impedance of a first external element designated for coupling to the first end over a range of signal frequencies carried by the transmission line. The second end has a second impedance that approximates the impedance of a second external element designated for coupling to the second end over the range of signal frequencies carried by the transmission line.

An embodiment of a method for designing an integrated circuit assembly includes the steps of identifying a range of frequencies that are desired for application to a transmission line, the transmission line comprising a pair of adjacent conductors having a first end and a second end opposed to the first end. Thereafter, identifying a first element designated for coupling to the first end of the transmission line and determining an impedance of the first element over the range of frequencies. In addition, identifying a second element designated for coupling to the second end of the transmission line and determining a desired impedance of the second element over the range of frequencies. Then, segmenting the transmission line to match the impedance of the first element and the impedance of the second element over the range of frequencies at both the first end and the second end of the transmission line such that segmenting comprises setting a constant width and a constant length for each segment.

An embodiment of a method for reducing return loss in a circuit assembly includes the steps of identifying a range of frequencies that are desired for application to a transmission line in an integrated circuit of the circuit assembly. Thereafter, determining a first impedance of a first element over the range of frequencies, the first element designated for coupling to a first end of the transmission line and determining a second impedance of a second element over the range of frequencies, the second element designated for coupling to a second end of the transmission line. Then, varying one or more characteristics of a pair of conductors forming the transmission line from the first end to the second end such that the impedance of the transmission line at the first end matches the impedance of the first element and the impedance of the transmission line at the second end matches the impedance of the second element over the identified range of frequencies.

The figures and detailed description that follow are not exhaustive. The disclosed embodiments are illustrated and described to enable one of ordinary skill to make and use the integrated circuits, methods for designing the same and methods for reducing return loss in an integrated circuit assembly. Other embodiments, features and advantages of the integrated circuits and methods will be or will become apparent to those skilled in the art upon examination of the following figures and detailed description. All such additional embodiments, features and advantages are within the scope of the integrated circuits, assemblies and methods as defined in the accompanying claims.

BRIEF DESCRIPTION OF THE FIGURES

The integrated circuit transmission lines, methods for designing integrated circuits using the same and methods for improving return loss can be better understood with reference to the following figures. The components within the figures are not necessarily to scale, emphasis instead being placed upon clearly illustrating the principles of adjusting physical characteristics of adjacent pairs of conductors forming a transmission line for improving return loss in integrated circuits and circuit assemblies. Moreover, in the figures, like reference numerals designate corresponding parts throughout the different views.

DETAILED DESCRIPTION

Embodiments of an integrated circuit and integrated circuit assemblies with reduced return loss use an improved approach in integrated circuit transmission line design. Specifically, transmission lines are arranged or configured to match the impedance at opposing ends of the transmission line over a frequency range of interest. By modifying one or more characteristics of the paired conductors forming a transmission line across the length of the transmission line, from a first end coupled to a first external element to a second end coupled to a second external element, circuit reflections are reduced and return loss is improved (i.e., reduced). At the first end, the transmission line has a first impedance designed to match the impedance of the circuit element designated to be coupled to the transmission line at the first end over the frequency range of interest. At the second or opposing end, the transmission line has a second impedance designed to match the impedance of a second circuit element designated to be coupled to the opposing end of the transmission line over the frequency range of interest. The improved approach reduces return loss of circuit assemblies using integrated circuits with the improved transmission lines over a band of frequencies where it is difficult to meet specified return loss levels.

An improved transmission line, methods for designing integrated circuits using the same and methods for improving return loss in an integrated circuit assembly to be described below will be described in the context of an integrated circuit, or a number of integrated circuit portions formed on a single die, also referred to as a "chip," and integrated into an integrated circuit (IC) package. Example combinations include a printed circuit board and the improved integrated circuit as well as a printed circuit board, the improved integrated circuit and a die. However, the improved transmission line can be implemented in any circuitry in which it is desirable to match impedance of a transmission line and thereby reduce return loss.

Although each of the illustrated embodiments includes integrated circuits with respective transmission lines arranged substantially along the longitudinal axis of a substrate, the transmission lines are not so limited. For example, transmission lines may be arranged with turns to avoid devices or active circuits on the integrated circuit. Furthermore, transmission lines may traverse layers of a multi-layer integrated circuit.

Figure 4:
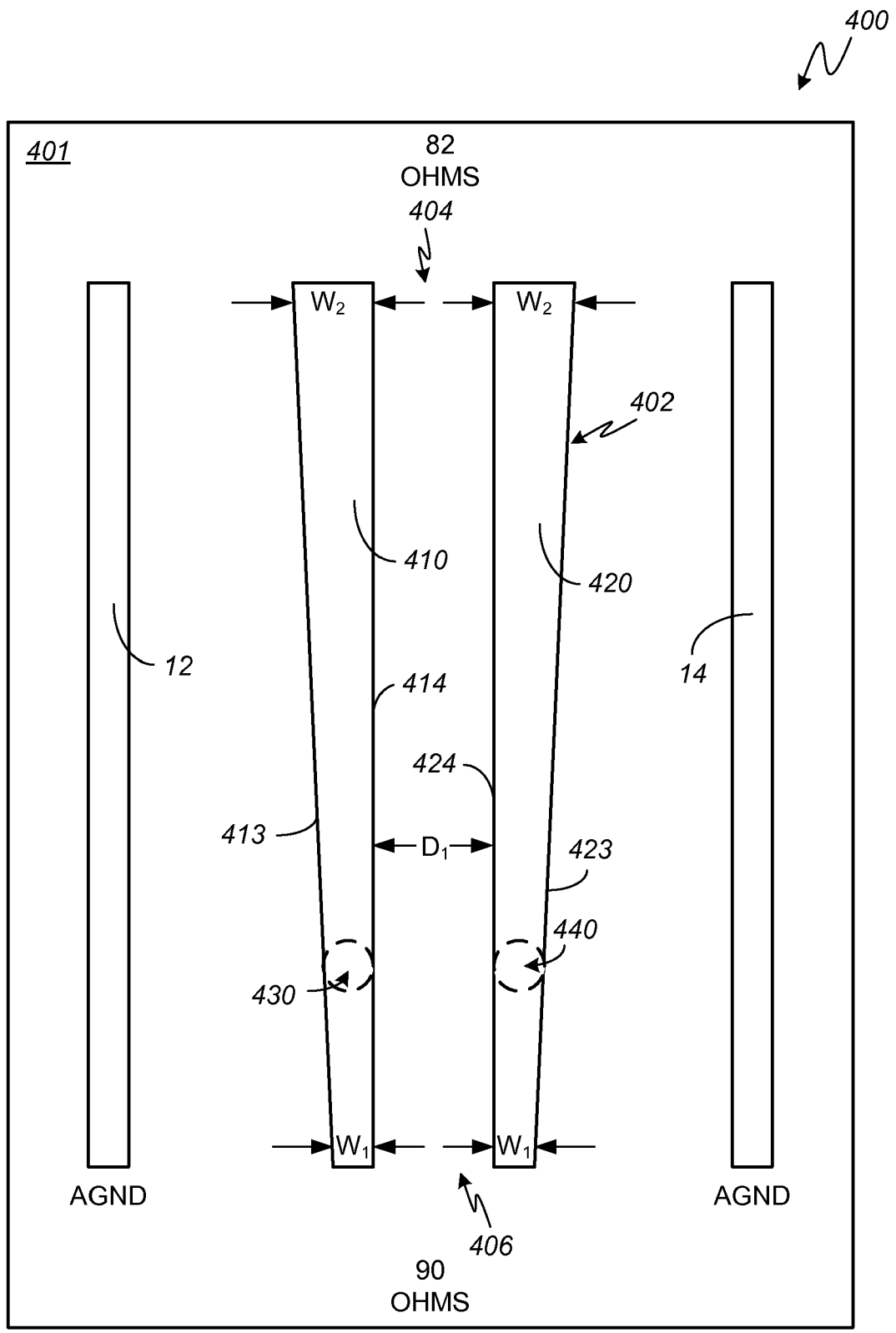
FIG. 4 is a top plan view of an embodiment of an improved metallization layer of an integrated circuit.

FIG. 4 is a top plan view of an embodiment of an improved metallization layer 400 of an integrated circuit. For simplicity of description, a small number of conductors are included. Typically, many more conductors are part of the metallization layer 400. Furthermore, the conductors are not illustrated to scale.

The improved metallization layer 400 includes ground 12 and ground 14 arranged along opposing edges of a substrate 401. A transmission line 402 including a pair of conductors is arranged between the ground 12 and the ground 14. The transmission line 402 has a first end 404, where a circuit element intended to be coupled to the transmission line 402 has a first impedance. In the illustrated embodiment, the first impedance is about 82 Ohms. The transmission line 402 has a second end 406 opposed to the first end 404. The second end 406 of the transmission line 402 is intended to be coupled to a second circuit element having a second impedance. In the illustrated embodiment, the second impedance is about 90 Ohms.

The transmission line 402 includes a first conductor 410 and a second conductor 420. The first conductor 410 includes a first edge 414 and an opposing edge 413. The opposing edge 413 is tapered or skewed with respect to the first edge 414 such that the width of the conductor 410 varies from a first width $W_1$ proximal the second end 406 to a second width $W_2$ proximal the first end 404. In the illustrated embodiment, the second width $W_2$ is wider than the first width $W_1$. However, the first width may be wider than the second width. The second conductor 420 includes an adjacent edge 424 and an opposing edge 423. The opposing edge 423 is tapered or skewed with respect to the adjacent edge 424 such that the width of the conductor 420 varies from a first width $W_1$ proximal the second end 406 to a second width $W_2$ proximal the first end 404. The first width $W_1$ and the second width $W_2$ of the respective conductors forming the transmission line 402 are approximately the same.

The first conductor 410 and the second conductor 420 are arranged substantially along the longitudinal axis of the substrate 401 and substantially in parallel with ground 12 and ground 14. The transmission line 402 is not so limited. As indicated above, the transmission line 402 may be arranged with turns to avoid devices or active circuits on the substrate 401. In addition, the transmission line 402 may traverse multiple layers of a multi-layer integrated circuit or be coupled across different layers using a via. A first via 430 couples the first conductor 410 to one or more circuit elements (not shown). A second via 440 couples the second conductor 420 to one or more circuit elements (not shown). Example circuit elements include a source, a load, a printed circuit board, an integrated circuit, a die, etc.

The first edge 414 of the first conductor 410 is arranged substantially parallel to the adjacent edge 424 of the second conductor 420. The first edge 414 and the adjacent edge 424 are separated by a distance $D_1$ along the length of the transmission line 402. The impedance as seen from the first end 404 of the transmission line 402 (i.e., 82 Ohms) and the impedance as seen from the second end 406 of the transmission line 402 (i.e. 90 Ohms) varies as a function of the width of the conductors forming the transmission line 402.

Figure 5:
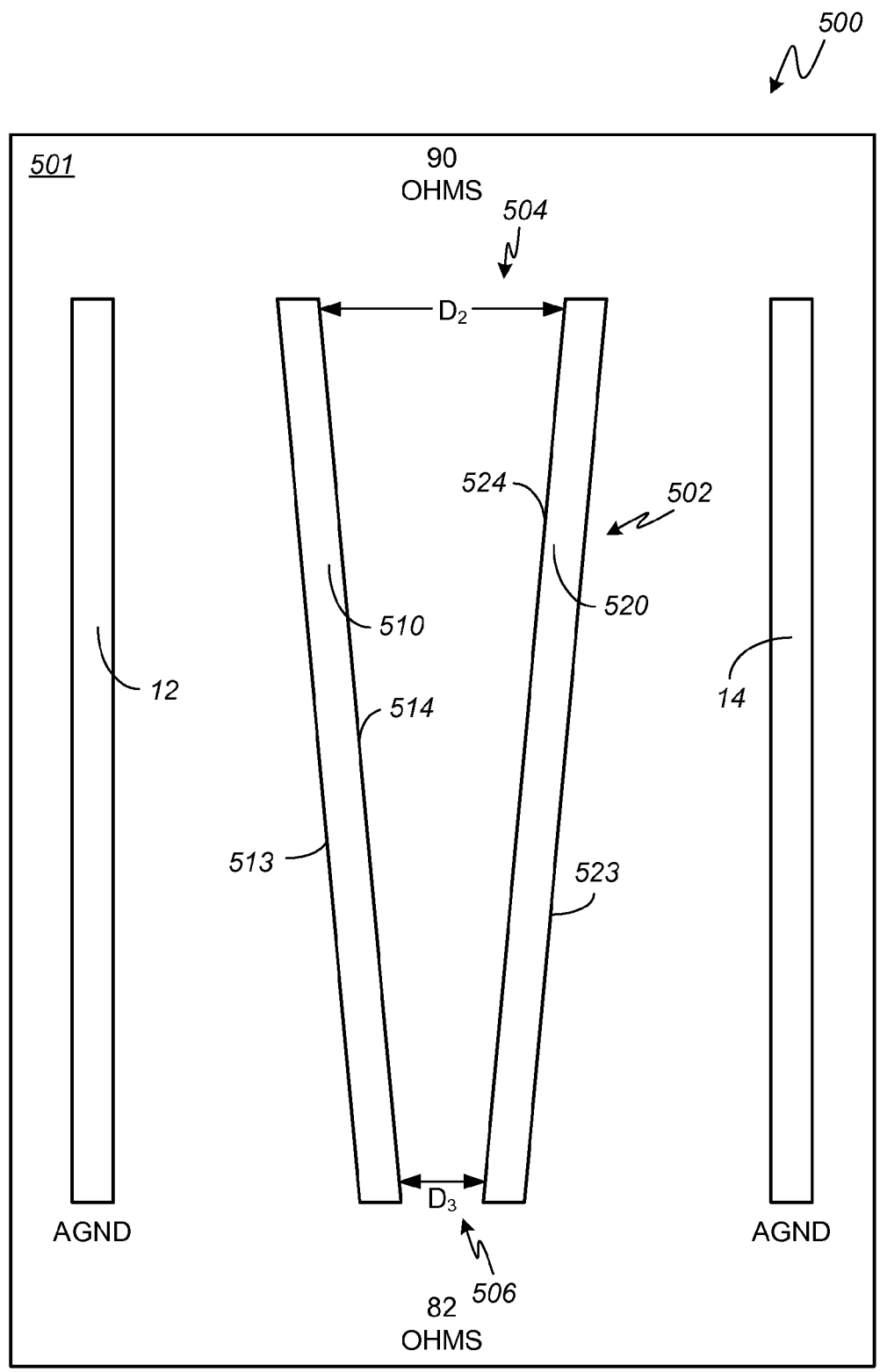
FIG. 5 is a top plan view of an alternative embodiment of an improved metallization layer of an integrated circuit.

FIG. 5 is a top plan view of an alternative embodiment of an improved metallization layer 500 of an integrated circuit. For simplicity of description, a small number of conductors are shown. Furthermore, the conductors are not illustrated to scale.

The improved metallization layer 500 includes ground 12 and ground 14 along opposing edges of a substrate 501. A transmission line 502 including a pair of conductors is arranged between the ground 12 and the ground 14. The transmission line 502 has a first end 504, where a circuit element intended to be coupled to the transmission line 502 has a first impedance of about 90 Ohms. The transmission line 502 has a second end 506 opposed to the first end 504. The second end 506 of the transmission line 502 is intended to be coupled to a second circuit element having a second impedance of about 82 Ohms.

The transmission line 502 includes a first conductor 510 and a second conductor 520. The first conductor 510 includes a first edge 514 and an opposing edge 513. The first edge 514 is substantially parallel to the opposing edge 513. Both the first edge 514 and the opposing edge 513 are skewed with respect to the ground 12 and the ground 14 such that the conductor 510 is further from ground 12 (and closer to the ground 14) at the second end 506 than at the first end 504. The second conductor 520 includes an adjacent edge 524 and an opposing edge 523. The adjacent edge 524 is substantially parallel to the opposing edge 513. Both the adjacent edge 524 and the opposing edge are skewed with respect to the ground 12 and the ground 14 such that the conductor 520 is further from ground 14 (and closer to the ground 12) at the second end 506 than at the first end 504.

While the first conductor 510 and the second conductor 520 are arranged such that a signal traversing the substrate 501 from the first end 504 of the transmission line 502 to the second end 506 of the transmission line 502 moves down the longitudinal axis of the substrate 501. The transmission line 502 is not so limited. As indicated above, the transmission line 502 may be arranged with turns to avoid devices or active circuits on the substrate 501. In addition, the transmission line 502 may traverse multiple layers of a multi-layer integrated circuit or be coupled across different layers using a via (not shown). It should be understood that such a via may be configured to match a local impedance of the transmission line 502 at the intersection of the corresponding conductor and the via. Example circuit elements that can be coupled to the transmission line 502 include a source, a load, a printed circuit board, an integrated circuit, a die, etc.

The first conductor 510 and the second conductor 520 are arranged such that the distance between the first conductor 510 and the second conductor 520 varies from a first separation distance $D_2$ proximal to the first end 504 to a second separation distance $D_3$ proximal to the second end 506. The first separation distance $D_2$ is longer than the second separation distance $D_3$. Due to electromagnetic coupling effects, the impedance as seen from the first end 504 of the transmission line 502 (i.e., 90 Ohms) and the impedance as seen from the second end 506 of the transmission line 502 (i.e. 82 Ohms) varies as a function of the distance between the first conductor 510 and the second conductor 520 forming the transmission line 502.

Figure 6:
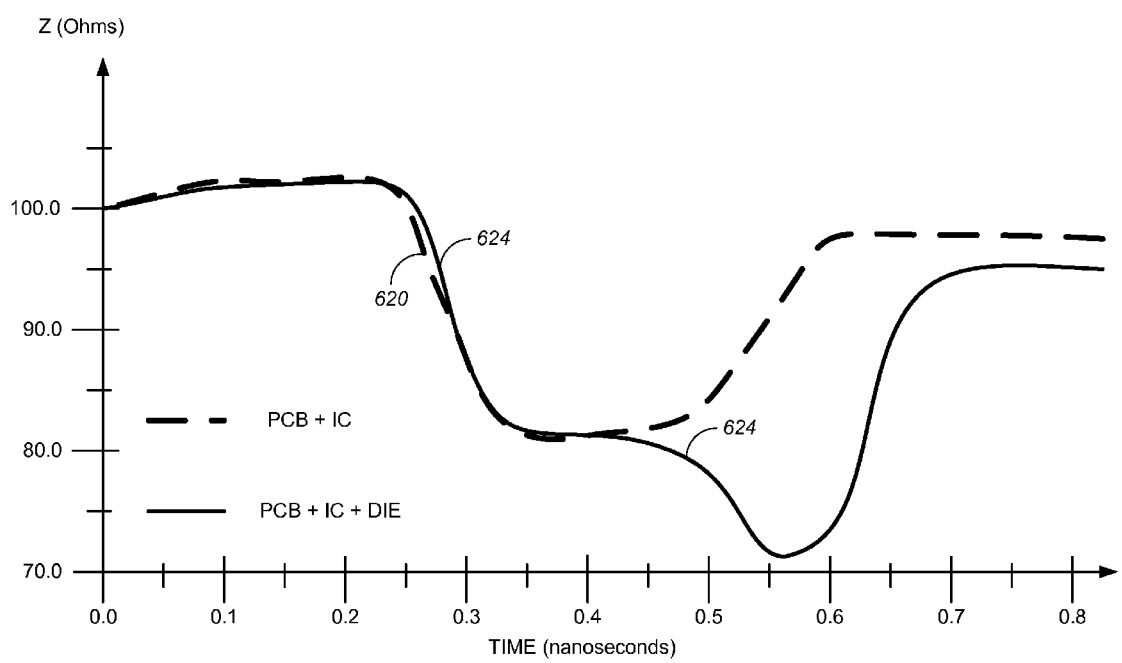
FIG. 6 is a plot illustrating time domain reflectometry data for circuits using the improved metallization layers of FIGS. 4 and 5.

FIG. 6 is a plot illustrating TDR data for circuit assemblies using the improved metallization layers of FIGS. 4 and 5. FIG. 6 illustrates the TDR data for a first combination of a printed-circuit board and an improved integrated circuit package, as well as a second combination of a die, a printed-circuit board and an improved integrated circuit package. An improved integrated circuit package includes one or transmission lines with a characteristic that varies along the length of the transmission line. The plot shows time in nanoseconds from a reference time of 0.0 nanoseconds at the left most side of the plot to 0.8 nanoseconds at the right most side of the plot vs. impedance in Ohms over a range of 70 to 105.

As indicated by the trace 620 the first combination of the printed circuit board and the improved integrated circuit package has a TDR of approximately 100 Ohms from 0.0 nanoseconds to nearly 0.25 nanoseconds. From approximately 0.25 nanoseconds to about 0.32 nanoseconds, the TDR falls to a plateau of approximately 82 Ohms. The plateau extends to about 0.42 nanoseconds, after which the TDR gradually falls to a local minimum of approximately 72 Ohms at about 0.56 nanoseconds. Thereafter, from between approximately 0.56 nanoseconds and 0.68 nanoseconds, the TDR rises until the TDR reaches about 95 Ohms. The trace 624, representing the second combination of the die, the printed-circuit board and the improved integrated circuit package, follows the trace 620 from 0.0 nanoseconds until just after 0.4 nanoseconds, where the TDR rises from the plateau at about 82 Ohms to about 97 Ohms at 0.58 nanoseconds. Thereafter, the TDR data falls slightly over the range from about 0.60 nanoseconds to 0.8 nanoseconds.

Figure 1:
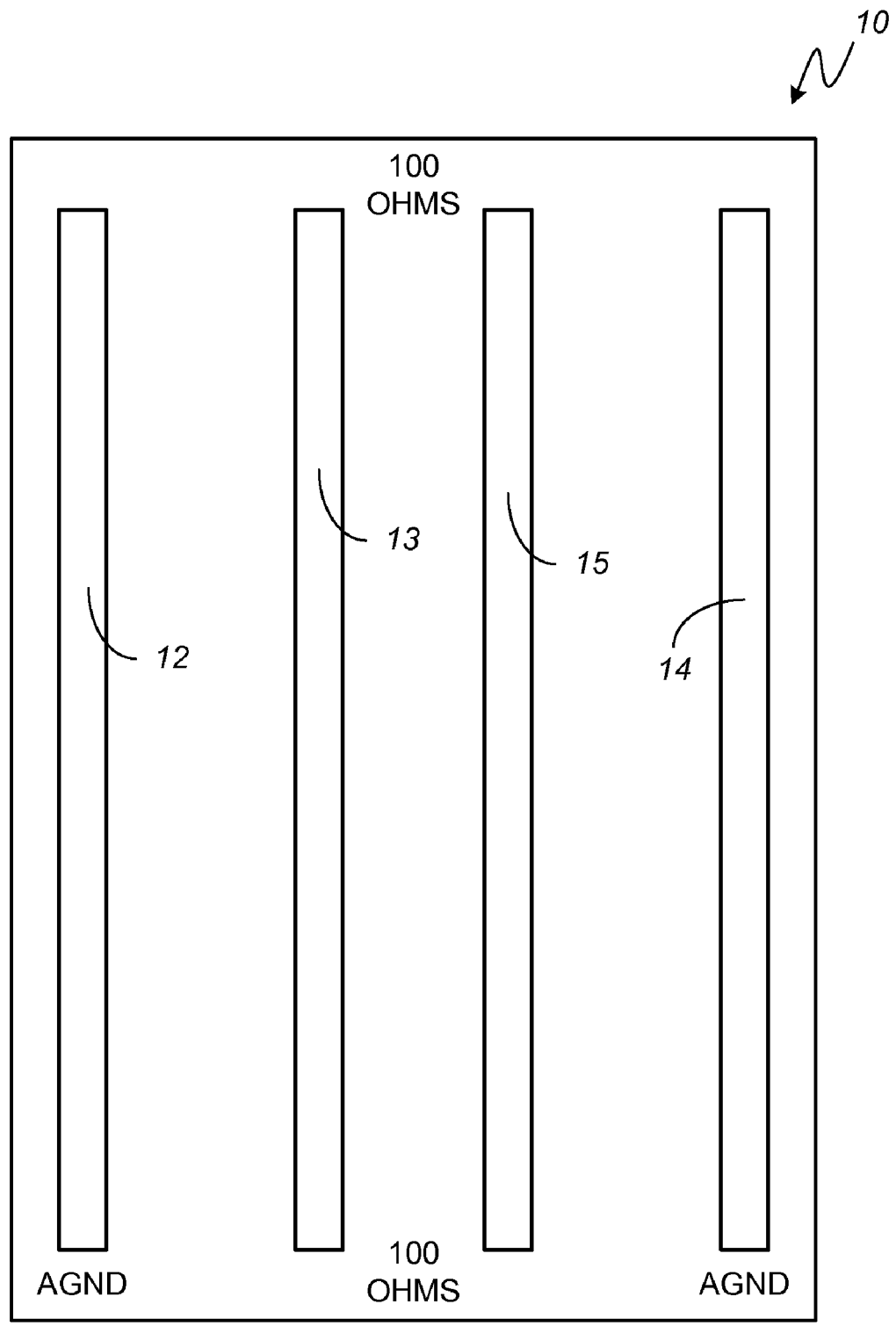
FIG. 1 is a simplified circuit diagram of an embodiment of a metallization layer in an integrated circuit.
Figure 2:
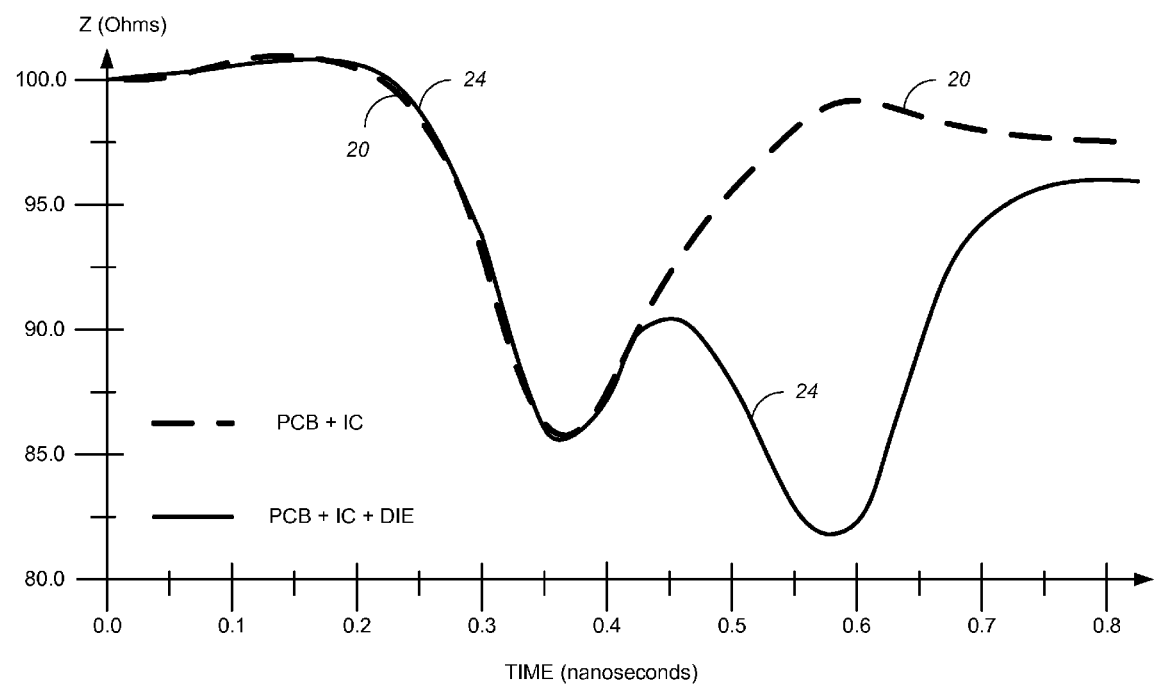
FIG. 2 is a plot illustrating time domain reflectometry data for two example integrated circuit assemblies.
Figure 3:
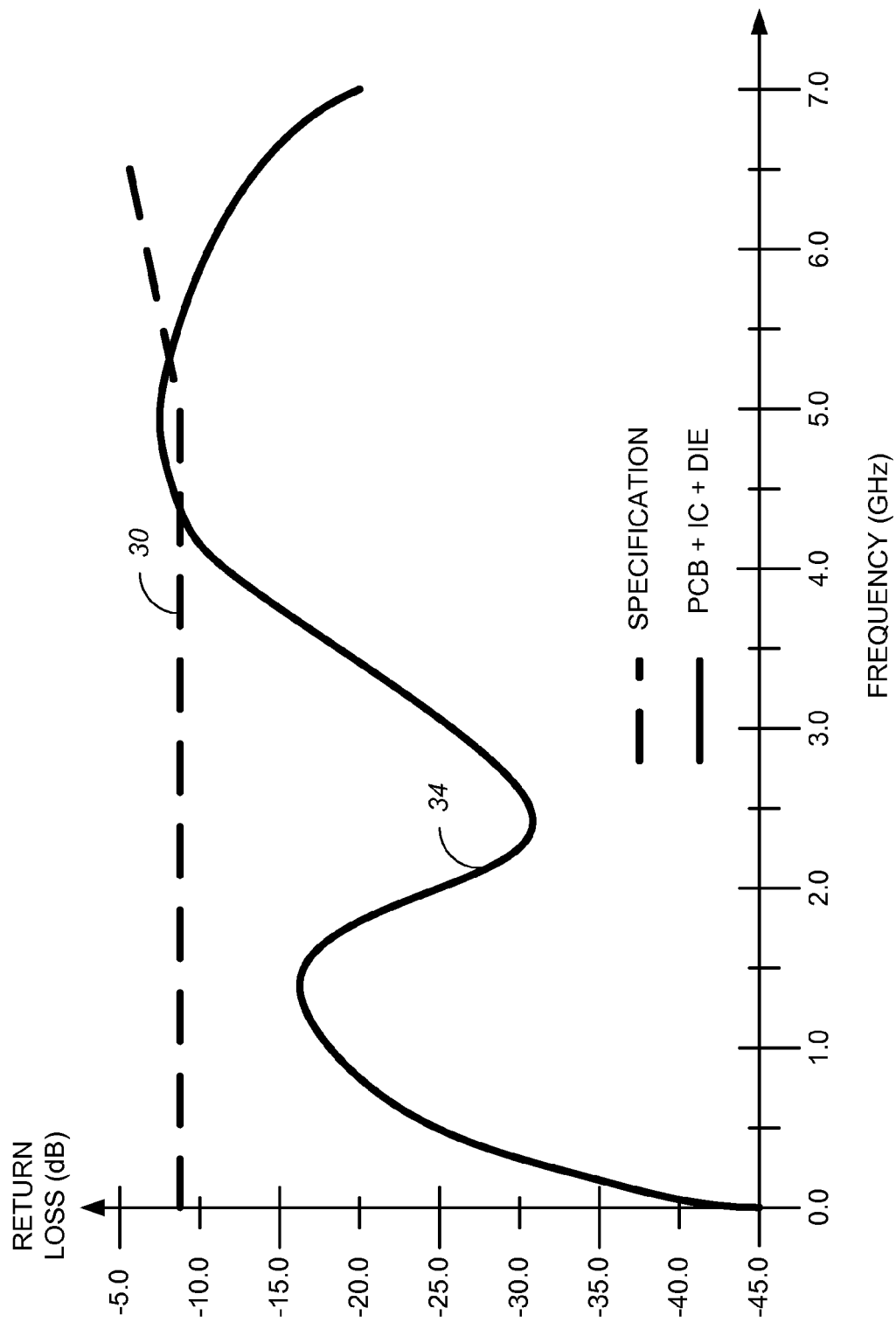
FIG. 3 is a plot illustrating return loss data for the two example integrated circuit assemblies of FIG. 2.

When compared to the TDR data for the combination of the printed-circuit board and a conventional 100 Ohm package and the combination of the die, printed-circuit board and the 100 Ohm package in FIG. 2, it is apparent that the impedance of the first and second circuit assembly combinations with the improved integrated circuit package is reduced over the range of about 0.35 nanoseconds to about 0.6 nanoseconds.

Figure 7:
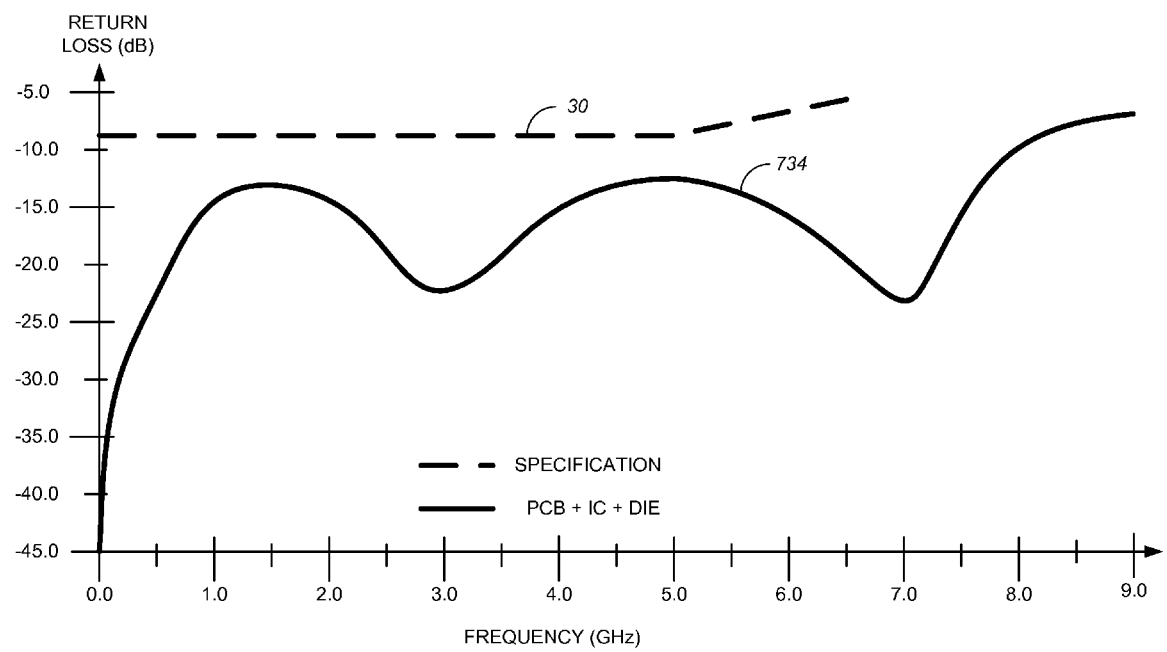
FIG. 7 is a plot illustrating return loss data for circuits using the improved metallization layers of FIGS. 4 and 5.

FIG. 7 is a plot illustrating return loss data for circuit assemblies using the improved metallization layers of FIGS. 4 and 5. FIG. 7 shows return loss in decibels (dB) vs. frequency in gigahertz (GHz) for a first combination of a printed-circuit board and an improved integrated circuit package and a second combination of a die, a printed-circuit board and the improved integrated circuit package. An improved integrated circuit package includes one or transmission lines with a characteristic that varies along the length of the transmission line. The plot in FIG. 7 shows frequency in GHz from a reference of 0.0 GHz at the left most side of the plot to 9.0 GHz at the right most side of the plot vs. return loss in decibels (dB) over a range of −45.0 dB to −5.0 dB.

Trace 30 represents a specified or maximum return loss as published by the CEI. As shown by trace 734, return loss increases from about −45 dB at 0 GHz to about −12 dB at 1.4 GHz. Thereafter, the return loss falls from the local maximum of about −12 dB to about −22 dB at approximately 2.9 GHz. From the local minimum at approximately 2.9 GHz, the return loss increases until about 5.0 GHz, where a local maximum value of about −12 dB is reached. From the local maximum at approximately 5.0 GHz, the return loss decreases until about 7.0 GHz, where the return loss is approximately −24.0 dB. From the local minimum at approximately 7.0 GHz, the return loss increases to about −6 dB at about 9.0 GHz. It is clear from the plot of FIG. 7 that the return loss for the circuit assembly (printed circuit board, improved integrated circuit package and die) remains under the specified maximum return loss over the entire range of signal frequencies.

For some circuit assemblies, a desired impedance of a circuit element coupled to a transmission line varies over a greater range of impedance values than the improved metallization layers of FIG. 4 and FIG. 5 can support. This is especially true for circuit assemblies that are designated for operation using a range of signal frequencies. It has been determined that an integrated circuit based transmission line can support a range of impedance values from about 100 Ohms to under 40 Ohms at operating frequencies of approximately 10 GHz.

Figure 8:
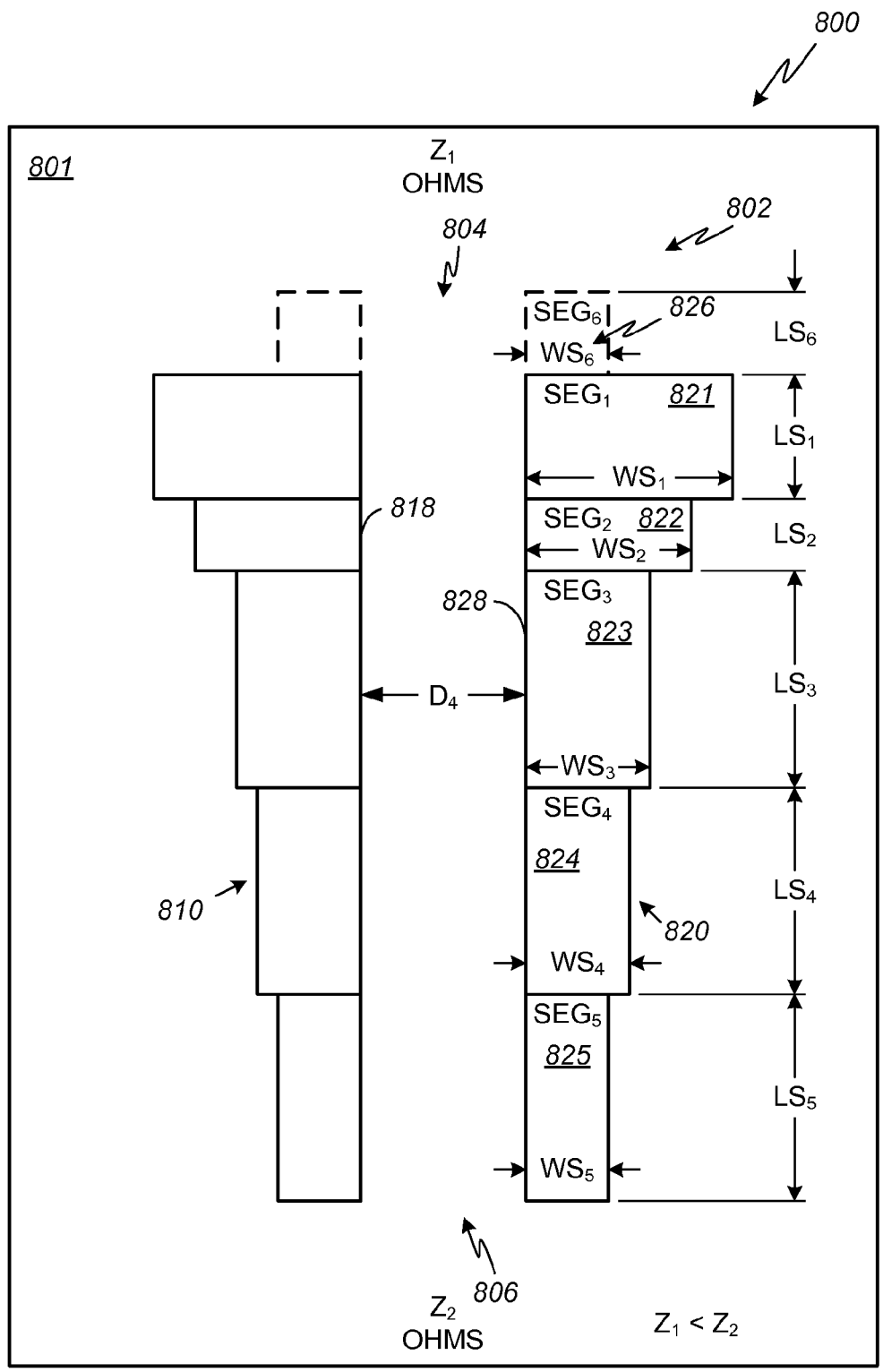
FIG. 8 is a top plan view illustrating a third embodiment of an improved metallization layer of an integrated circuit.

FIG. 8 is a top plan view illustrating a third embodiment of an improved metallization layer 800 of an integrated circuit. The metallization layer 800 includes a pair of segmented conductors. For simplicity of description, only a single transmission line 802 is included. Furthermore, the conductors forming the single transmission line 802 are illustrated in scale with respect to each other. The transmission line 802 is not to scale with respect to the substrate 801.

The improved metallization layer 800 includes a transmission line 802 with a first end 804, where a circuit element intended to be coupled to the transmission line 802 has an impedance of about $Z_1$ Ohms. The transmission line 802 has a second end 806 opposed to the first end 804. The second end 806 of the transmission line 802 is intended to be coupled to a second circuit element having an impedance of about $Z_2$ Ohms.

The transmission line 802 includes a first conductor 810 and a second conductor 820. The first conductor 810 and the second conductor 820 are configured substantially alike. For simplicity and economy of illustration and description, only the details of the second conductor 820 are illustrated in FIG. 8 and described herein. It should be understood that such details are also associated with the first conductor 810 of the transmission line 802.

The second conductor 820 includes a first or reference edge 828 against which a plurality of segments is arranged to the right. The segments are arranged sequentially from the first end 804 to the second end 806 of the second conductor 820. An optional segment 826 located closest to the first end 804 will be described in greater detail below. A first segment 821 is defined by a width of $WS_1$ and a length of $LS_1$. A second segment 822 is provided adjacent and below the first segment 821. The second segment 822 is defined by a width $WS_2$ and a length of $LS_2$. A third segment 823 is provided adjacent and below the second segment 822. The third segment 823 is defined by a width $WS_3$ and a length of $LS_3$. A fourth segment 824 is provided adjacent and below the third segment 823. The fourth segment 824 is defined by a width $WS_4$ and a length of $LS_4$. A fifth segment 825 is provided adjacent and below the fourth segment 824. The fifth segment 825 is defined by a width $WS_5$ and a length of $LS_5$.

Each of the respective segment lengths is defined along the transmission line 802 between the first end 804 and the second end 806. Each respective length is selected to generate a respective resonant frequency. That is, that segment of the transmission line 802 will resonate when a signal is present on the transmission line 802 and operating at the resonant frequency. While the return loss of the transmission line 802 at these specific resonant frequencies may increase, the series combination of the segments allows the transmission line 802 to carry signals with improved (i.e., reduced) return loss over a broad range of frequencies. The applicants have realized an improvement of 3 dB to 4 dB in return loss in circuit assemblies using the improved transmission line 802 over a range of frequencies from about 4.5 GHz to 5.5 GHz, where it has been difficult for circuit assemblies employing conventional 100 Ohm transmission lines to meet the CEI specification.

The respective segment widths of the first segment 821, the second segment 822, the third segment 823, the fourth segment 824 and the fifth segment 825 decrease in magnitude to increase the impedance along the transmission line 802 from $Z_1$ to $Z_2$. That is, $Z_2 > Z_1$.

The first conductor 810 includes a first or reference edge 818 against which a plurality of segments is arranged to the left. The reference edge 818 of the first conductor 810 is arranged substantially parallel to the reference edge 828 of the second conductor 820. The reference edge 818 and the reference edge 828 are separated by a distance $D_4$ along the length of the transmission line 802.

The first conductor 810 and the second conductor 820 are arranged substantially along the longitudinal axis of the substrate 801. The transmission line 802 is not so limited. As indicated above, the transmission line 802 may be arranged with turns to avoid devices or active circuits on the substrate 801. In addition, the transmission line 802 may traverse layers of a multi-layer integrated circuit or be coupled using a via (not shown). Example circuit elements that can be coupled to the transmission line 802 include a source, a load, a printed circuit board, an integrated circuit, a die, etc.

Figure 9:
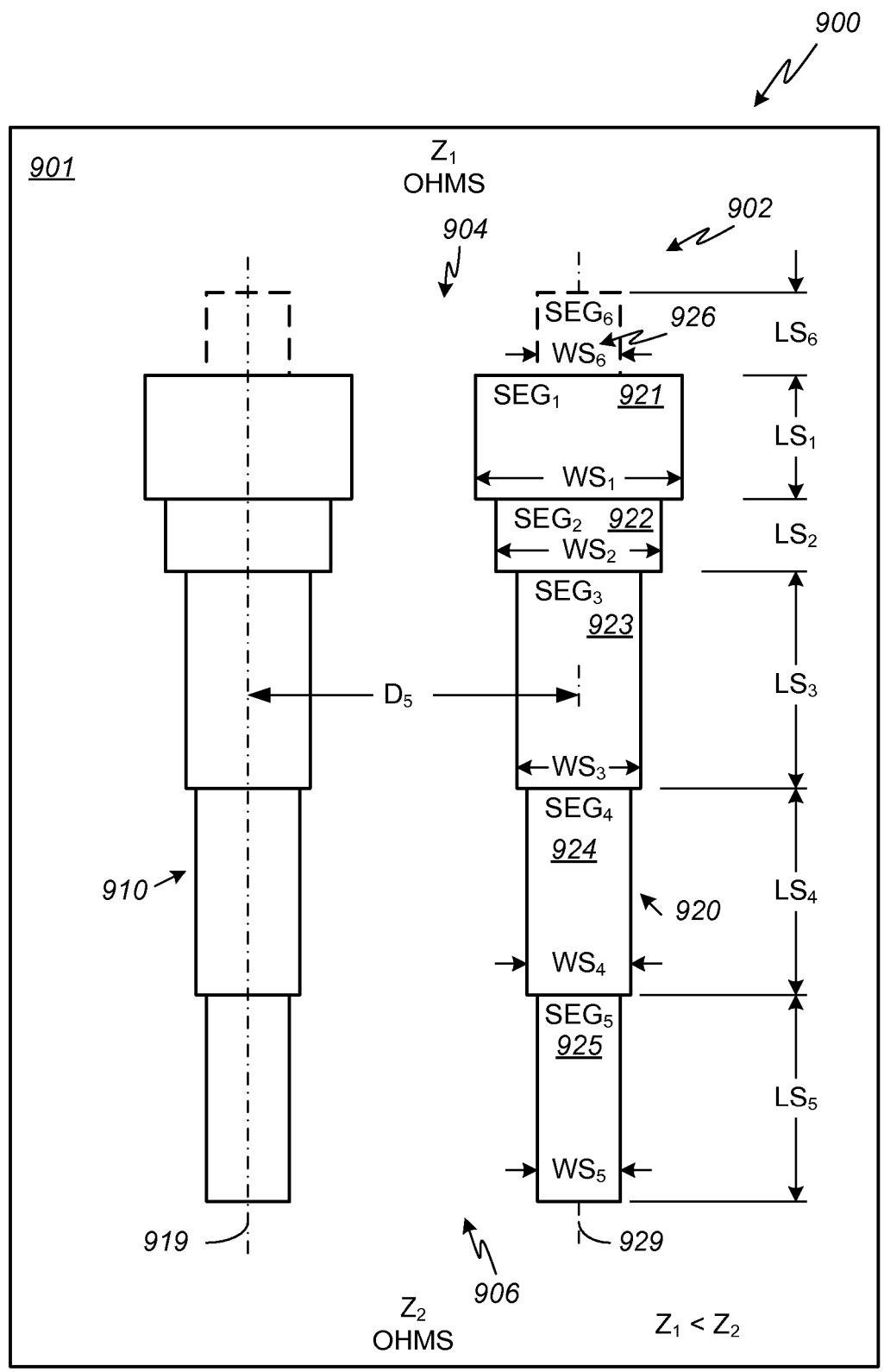
FIG. 9 is a top plan view illustrating a fourth embodiment of an improved metallization layer of an integrated circuit.

FIG. 9 is a top plan view illustrating a fourth embodiment of an improved metallization layer 900 of an integrated circuit. The metallization layer 900 includes a pair of segmented conductors. For simplicity of description, only a single transmission line 902 is included. Furthermore, the conductors forming the single transmission line 902 are illustrated in scale with respect to each other. The transmission line 902 is not to scale with respect to the substrate 901.

The improved metallization layer 900 includes a transmission line 902 with a first end 904, where a circuit element intended to be coupled to the transmission line 902 has an impedance of about $Z_1$ Ohms. The transmission line 902 has a second end 906 opposed to the first end 904. The second end 906 of the transmission line 902 is intended to be coupled to a second circuit element having an impedance of about $Z_2$ Ohms.

The transmission line 902 includes a first conductor 910 and a second conductor 920. The first conductor 910 and the second conductor 920 are configured substantially alike. For simplicity and economy of illustration and description, only the details of the second conductor 920 are illustrated in FIG. 9 and described herein. It should be understood that such details are also associated with the first conductor 910 of the transmission line 902.

The second conductor 920 includes a plurality of segments arranged about a centerline 929. (The first conductor 910 includes a plurality of similarly configured segments arranged about a respective centerline 919.) The segments are arranged sequentially from the first end 904 to the second end 906 of the second conductor 920. An optional segment 926 located closest to the first end 904 will be described in greater detail below. A first segment 921 is defined by a width of $WS_1$ and a length of $LS_1$. A second segment 922 is provided adjacent and below the first segment 921. The second segment 922 is defined by a width $WS_2$ and a length of $LS_2$. A third segment 923 is provided adjacent and below the second segment 922. The third segment 923 is defined by a width $WS_3$ and a length of $LS_3$. A fourth segment 924 is provided adjacent and below the third segment 923. The fourth segment 924 is defined by a width $WS_4$ and a length of $LS_4$. A fifth segment 925 is provided adjacent and below the fourth segment 924. The fifth segment 925 is defined by a width $WS_5$ and a length of $LS_5$.

Each of the respective segment lengths is defined along the transmission line 902 between the first end 904 and the second end 906. Each respective length is selected to generate a respective resonant frequency. That is, that segment of the transmission line 902 will resonate when a signal is present on the transmission line 902 and operating at the resonant frequency. While the return loss of the transmission line 902 at these specific resonant frequencies may increase, the series combination of the segments allows the transmission line 902 to carry signals with improved (i.e., reduced) return loss over a broad range of frequencies. The applicants have realized an improvement of 3 dB to 4 dB in return loss in circuit assemblies using the improved transmission line 902 over a range of frequencies from about 4.5 GHz to 5.5 GHz, where it has been difficult for circuit assemblies employing conventional 100 Ohm transmission lines to meet the CEI specification.

The respective segment widths of the first segment 921, the second segment 922, the third segment 923, the fourth segment 924 and the fifth segment 925 decrease in magnitude to increase the impedance along the transmission line 902 from $Z_1$ to $Z_2$. That is, $Z_2 > Z_1$.

The first conductor 910 and the second conductor 920 are separated by a distance $D_5$ defined from centerline 919 to centerline 929 along the length of the transmission line 902.

The first conductor 910 and the second conductor 920 are arranged substantially along the longitudinal axis of the substrate 901. The transmission line 902 is not so limited. As indicated above, the transmission line 902 may be arranged with turns to avoid devices or active circuits on the substrate 901. In addition, the transmission line 902 may traverse layers of a multi-layer integrated circuit or be coupled using a via (not shown). Example circuit elements that can be coupled to the transmission line 902 include a source, a load, a printed circuit board, an integrated circuit, a die, etc.

Figure 10:
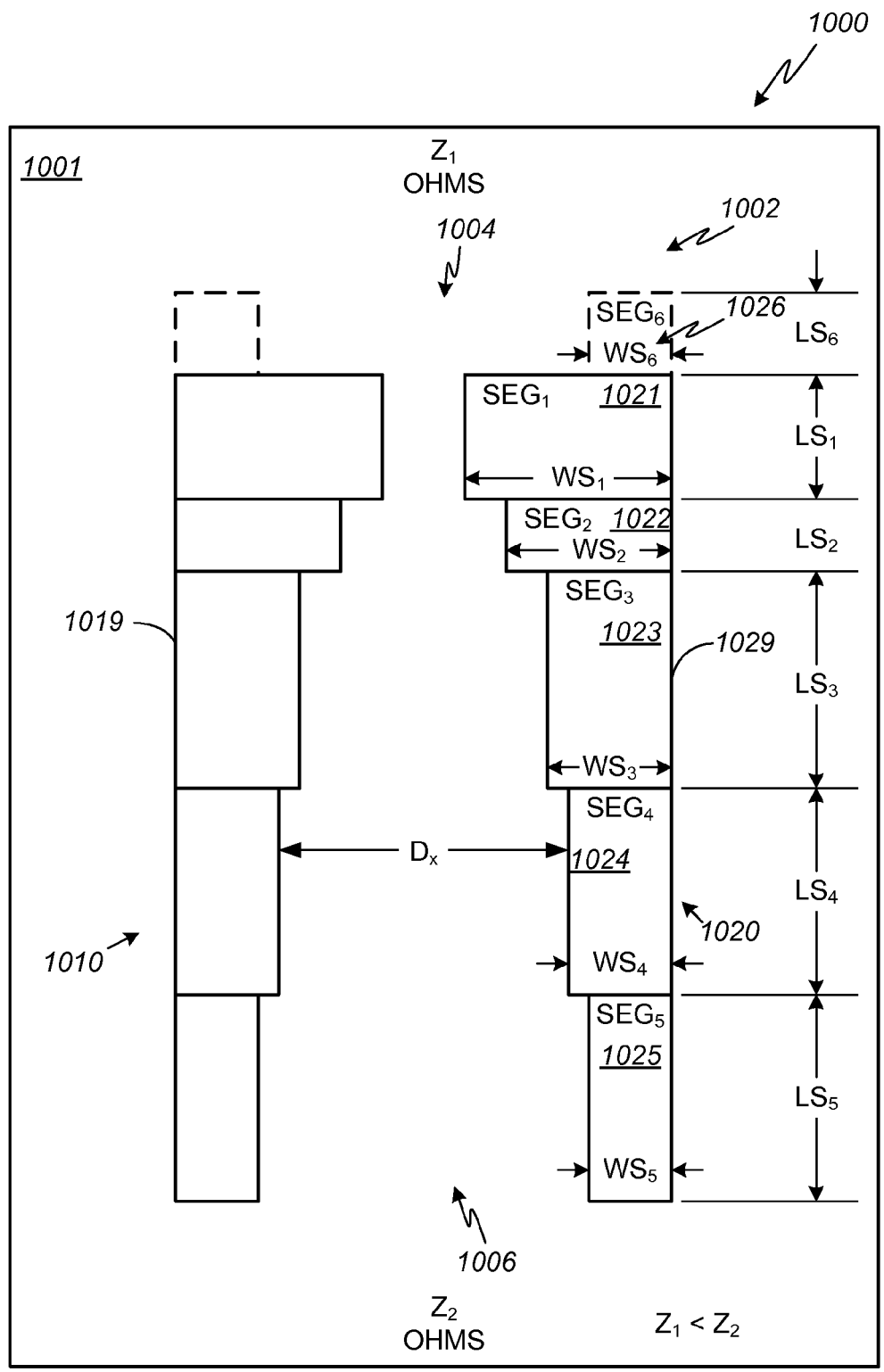
FIG. 10 is a top plan view illustrating a fifth embodiment of an improved metallization layer of an integrated circuit.

FIG. 10 is a top plan view illustrating a fourth embodiment of an improved metallization layer 1000 of an integrated circuit. The metallization layer 1000 includes a pair of segmented conductors. For simplicity of description, only a single transmission line 1002 is included. Furthermore, the conductors forming the single transmission line 1002 are illustrated in scale with respect to each other. The transmission line 1002 is not to scale with respect to the substrate 1001.

The improved metallization layer 1000 includes a transmission line 1002 with a first end 1004, where a circuit element intended to be coupled to the transmission line 1002 has an impedance of about $Z_1$ Ohms. The transmission line 1002 has a second end 1006 opposed to the first end 1004. The second end 1006 of the transmission line 1002 is intended to be coupled to a second circuit element having an impedance of about $Z_2$ Ohms.

The transmission line 1002 includes a first conductor 1010 and a second conductor 1020. The first conductor 1010 and the second conductor 1020 are configured substantially alike. For simplicity and economy of illustration and description, only the details of the second conductor 1020 are illustrated in FIG. 10 and described herein. It should be understood that such details are also associated with the first conductor 1010 of the transmission line 1002.

The second conductor 1020 includes a plurality of segments arranged about a common edge 1029. (The first conductor 1010 includes a plurality of similarly configured segments arranged about an opposing common edge 1019.) The segments are arranged sequentially from the first end 1004 to the second end 1006 of the second conductor 1020. An optional segment 1026 located closest to the first end 1004 will be described in greater detail below. A first segment 1021 is defined by a width of $WS_1$ and a length of $LS_1$. A second segment 1022 is provided adjacent and below the first segment 1021. The second segment 1022 is defined by a width $WS_2$ and a length of $LS_2$. A third segment 1023 is provided adjacent and below the second segment 1022. The third segment 1023 is defined by a width $WS_3$ and a length of $LS_3$. A fourth segment 1024 is provided adjacent and below the third segment 1023. The fourth segment 1024 is defined by a width $WS_4$ and a length of $LS_4$. A fifth segment 1025 is provided adjacent and below the fourth segment 1024. The fifth segment 1025 is defined by a width $WS_5$ and a length of $LS_5$.

Each of the respective segment lengths is defined along the transmission line 1002 between the first end 1004 and the second end 1006. Each respective length is selected to generate a respective resonant frequency. That is, that segment of the transmission line 1002 will resonate when a signal is present on the transmission line 1002 and operating at the resonant frequency. While the return loss of the transmission line 1002 at these specific resonant frequencies may increase, the series combination of the segments allows the transmission line 1002 to carry signals with improved (i.e., reduced) return loss over a broad range of frequencies. The applicants have realized an improvement of 3 dB to 4 dB in return loss in circuit assemblies using the improved transmission line 1002 over a range of frequencies from about 4.5 GHz to 5.5 GHz, where it has been difficult for circuit assemblies employing conventional 100 Ohm transmission lines to meet the CEI specification.

The respective segment widths of the first segment 1021, the second segment 1022, the third segment 1023, the fourth segment 1024 and the fifth segment 1025 decrease in magnitude to increase the impedance along the transmission line 1002 from $Z_1$ to $Z_2$. That is, $Z_2 > Z_1$.

The first conductor 1010 and the second conductor 1020 are separated by a distance Dx defined from the respective adjacent edges of corresponding segments along the length of the transmission line 902. Dx varies and increases from the first segment to the fifth segment.

The first conductor 1010 and the second conductor 1020 are arranged substantially along the longitudinal axis of the substrate 1001. The transmission line 1002 is not so limited. As indicated above, the transmission line 1002 may be arranged with turns to avoid devices or active circuits on the substrate 1001. In addition, the transmission line 1002 may traverse layers of a multi-layer integrated circuit or be coupled using a via (not shown). Example circuit elements that can be coupled to the transmission line 1002 include a source, a load, a printed circuit board, an integrated circuit, a die, etc.

As described in association with the embodiments illustrated in FIGS. 8-10, each of the segments forming a respective conductor of the transmission line is arranged with a segment length and a segment width. The segment length and the segment width are substantially constant over the entire segment. When other characteristics of the transmission line remain constant, as the width of the conductor pairs decreases the impedance increases. Thus, a relatively narrower segment will present a greater impedance than a relatively wider segment. The respective lengths of each segment forming the transmission line are selected to generate improved return loss data over a greater range of frequencies than that possible when a common length is shared by each segment. The combination of the segment length and the relatively abrupt change in the width at the intersection between segments creates a resonant frequency within each segment. The series combination of segments with select and different resonant frequencies generates improved return loss over a greater range of frequencies than a single segment where width alone is varied across the length of the segment.

In general, the respective widths of each segment forming a transmission line will decrease along the length of the transmission line as a signal traverses from a first end with a lower impedance to a second end with a higher impedance. However, it is possible to generate improved return loss data over a greater range of frequencies by adding one or more optional segments with a relatively narrower width at the end of the transmission line with a lower target or desired impedance. Each of the optional segment 826 (FIG. 8), the optional segment 926 (FIG. 9) and the optional segment 1026 (FIG. 10) is defined by a width $WS_6$ and a length $LS_6$ that remains substantially the same across the segment. Such a segmented transmission line (e.g., the transmission line 802 of FIG. 8 with the optional sixth segment 826, the transmission line 902 of FIG. 9 with the optional sixth segment 926, or the transmission line 1002 of FIG. 10 with the optional sixth segment 1026) will present a slightly higher return loss for signals in the range of about 1 GHz to about 2 GHz than that observed for signals applied to a transmission line without the optional segment. In return for the higher return loss over the relatively lower frequencies, the return loss for signals in the range of about 4 GHz to 10 GHz is reduced.

As further described in association with the embodiments illustrated in FIGS. 8-10, the distance between the respective conductors of a segmented transmission line can be controlled in at least three ways. A first option includes arranging adjacent edges of the pair of conductors over each segment such that corresponding segments are separated by a common distance. A second option includes arranging the pair of adjacent conductors such that a distance between respective centerlines of the adjacent conductors remains constant from a first segment to a second segment or across all segments forming the transmission line. A third option includes arranging opposing edges of the pair of conductors such that the distance between the opposing edges of the adjacent conductors remains constant across all segments forming the transmission line.

Figure 11:
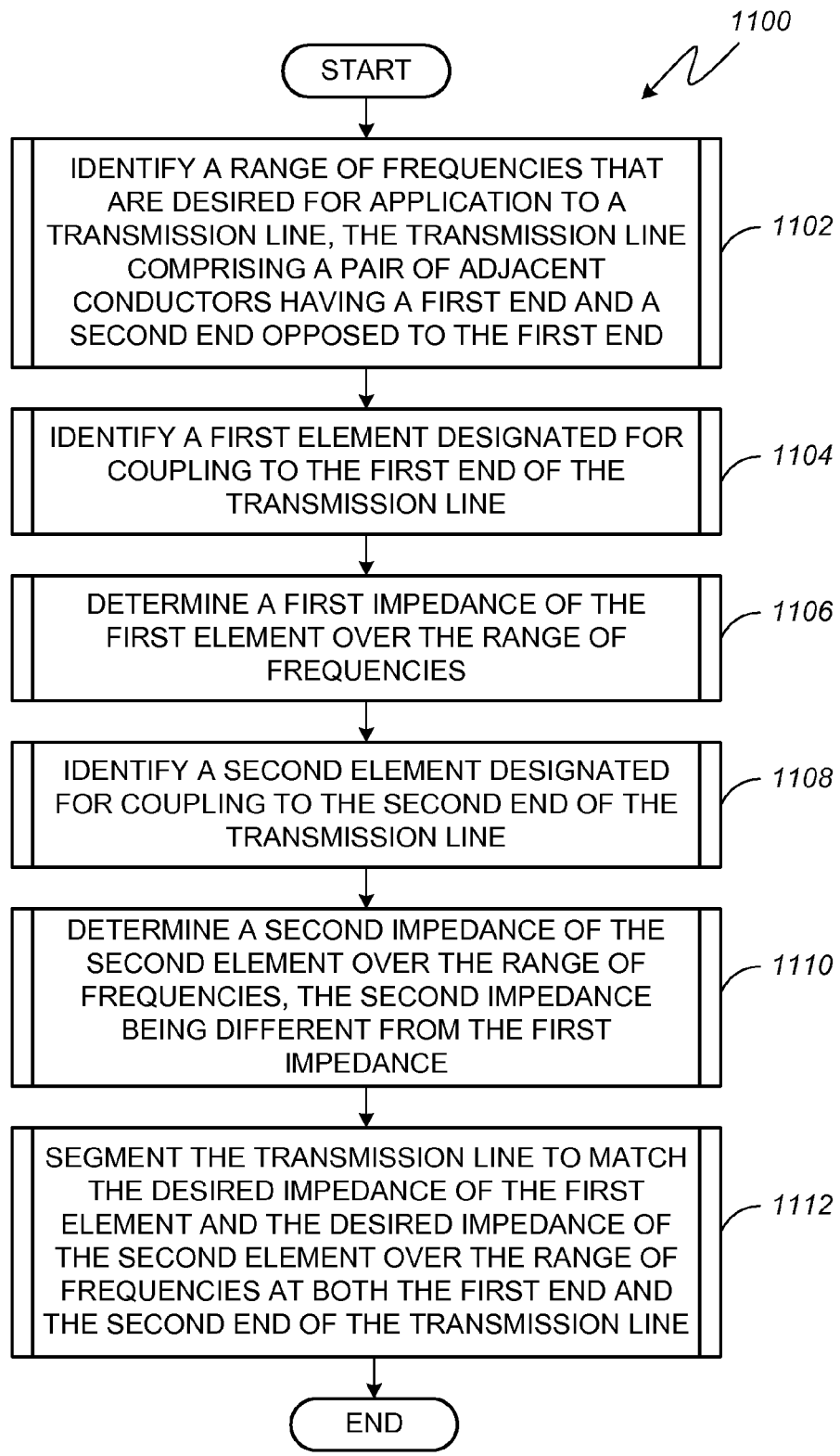
FIG. 11 is a flow diagram illustrating an embodiment of a method for designing an integrated circuit assembly.

FIG. 11 is a flow diagram illustrating an embodiment of a method 1100 for designing an integrated circuit assembly. Method 1100 begins with block 1102 where an integrated circuit designer or a design tool identifies a range of frequencies that are to be applied to a transmission line. As further indicated in block 1102, the transmission line includes a pair of adjacent conductors having a first end and a second end. In block 1104, a first element designated for coupling to the first end of the transmission line is identified. In block 1106, a first impedance of the first element over the range of frequencies is identified. In block 1108, a second element designated for coupling to the second end of the transmission line is identified. In block 1110, a second impedance of the second element over the range of frequencies is identified. As further indicated in block 1110, the second impedance is different than the first impedance over the range of frequencies. Thereafter, as indicated in block 1112, the transmission line is segmented to match the first impedance of the first element designated for coupling to the first end of the transmission line and to match the second impedance of the second element designated for coupling to the second end of the transmission line.

Exemplary steps for designing an integrated circuit assembly are illustrated in FIG. 11. The particular sequence of the steps or functions in blocks 1102 through 1110 is presented for illustration. It should be understood that the order of the steps or functions in blocks 1102 through 1110 can be performed in any other suitable order.

Figure 12:
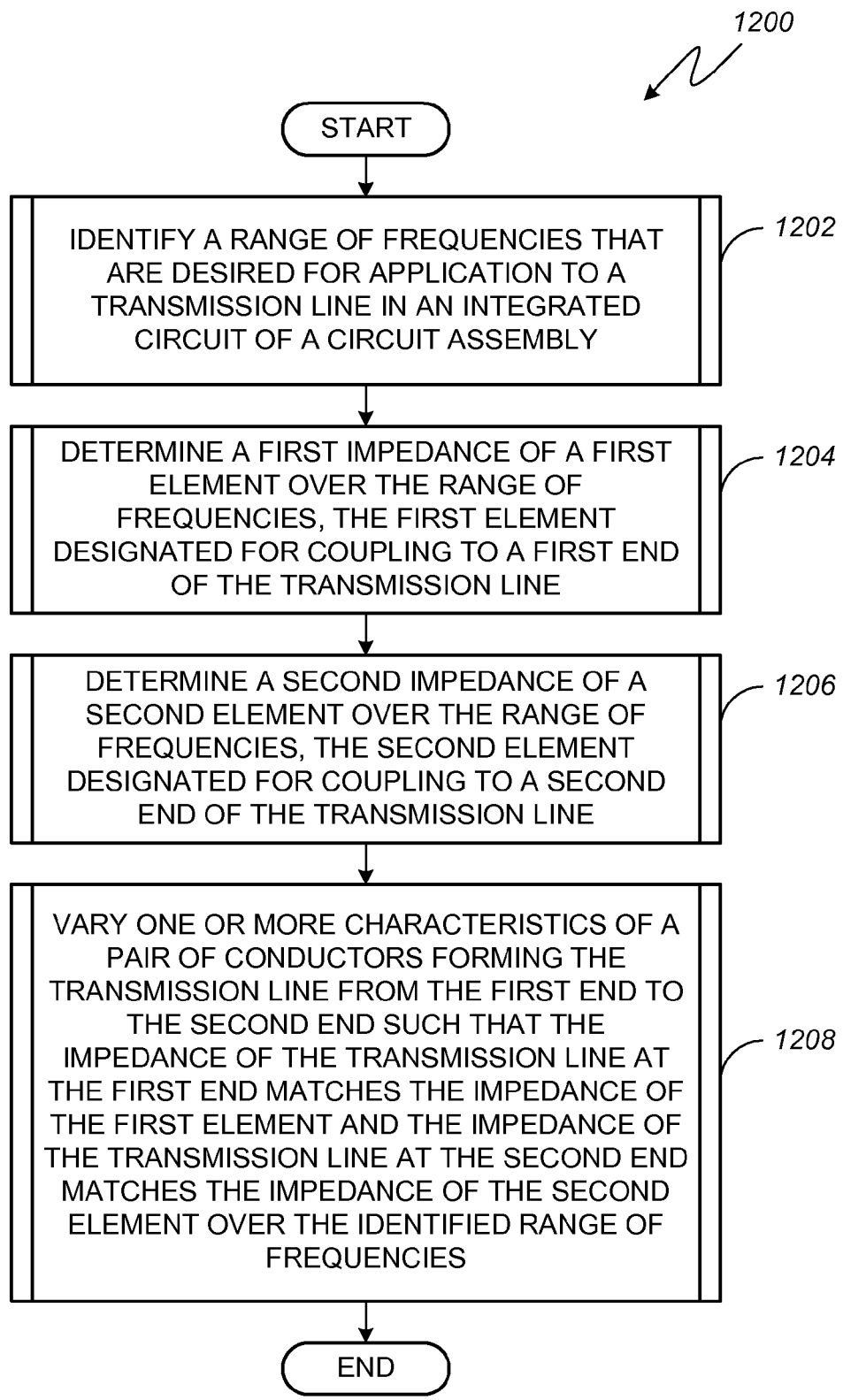
FIG. 12 is a flow diagram illustrating an embodiment of a method for reducing return loss in an integrated circuit assembly.

FIG. 12 is a flow diagram illustrating an embodiment of a method 1200 for reducing return loss in an integrated circuit assembly. Method 1200 begins with block 1202 where an integrated circuit designer or a design tool identifies a range of frequencies that are to be applied to a transmission line in an integrated circuit of a circuit assembly. In block 1204, a first impedance of a first element designated for coupling to a first end of the transmission line is determined over the range of frequencies. In block 1206, a second impedance of a second element designated for coupling to a second end of the transmission line is determined over the range of frequencies. Thereafter, as shown in block 1208, one or more characteristics of a pair of conductors forming the transmission line are varied from the first end to the second end such that the impedance of the transmission line at the first end matches the impedance of the first element and the impedance of the transmission line at the second end matches the impedance of the second element over the identified range of frequencies.

Exemplary steps for reducing return loss in an integrated circuit assembly are illustrated in FIG. 12. The particular sequence of the steps or functions in blocks 1202 through 1206 is presented for illustration. It should be understood that the order of the steps or functions in blocks 1202 through 1206 can be performed in any other suitable order.

While various embodiments of the integrated circuit transmission lines, methods for designing integrated circuits using the same and methods for improving return loss over a frequency range of interest have been described, it will be apparent to those of ordinary skill in the art that many more embodiments and implementations are possible that are within the scope of this disclosure. Accordingly, the described circuits, assemblies and methods are not to be restricted or otherwise limited except in light of the attached claims and their equivalents.

What is claimed is:

1. A transmission line, comprising:
  a pair of adjacent conductors in an integrated circuit, the adjacent conductors having segments arranged with a constant width and a constant length over each segment, wherein the respective lengths of each segment are selected to improve return loss over a greater range of frequencies than when a common length is shared by each segment;
  a first end having a first impedance that approximates the impedance of a first external element designated for coupling at the first end over a range of signal frequencies carried by the transmission line; and
  a second end having a second impedance that approximates the impedance of a second external element designated for coupling at the second end over the range of signal frequencies carried by the transmission line.

2. The transmission line of claim 1, wherein the impedance of the transmission line varies from the first impedance to the second impedance when the first impedance is not the same as the second impedance.

3. The transmission line of claim 1, wherein a width of the respective adjacent conductors varies from a first width over a first segment at the first end to a second width over a second segment at the second end.

4. The transmission line of claim 1, wherein a distance between adjacent edges of the pair of conductors varies with distance along the transmission line.

5. The transmission line of claim 1, further comprising:
  a first segment having a first length along the transmission line and a first width; and
  a second segment having a second length along the transmission line and a second width, wherein the first length and the first width of the first segment and the second length and the second width are selected to reduce return loss over a range of frequencies.

6. The transmission line of claim 5, wherein respective center lines of each conductor of the transmission line are separated by a common distance over the first segment and the second segment.

7. A method for reducing return loss in a circuit assembly, comprising:
    identifying a range of frequencies that are desired for application to transmission line in an integrated circuit of the circuit assembly;
    determining a first impedance of a first element over the range of frequencies, the first element designated for coupling to a first end of the transmission line;
    determining a second impedance of a second element over the range of frequencies, the second element designated for coupling to a second end of the transmission line; and
    varying one or more characteristics of a pair of conductors forming the transmission line from the first end to the second end such that the impedance of the transmission line at the first end matches the impedance of the first element and the impedance of the transmission line at the second end matches the impedance of the second element over the identified range of frequencies, wherein the varying generates segments along the transmission line, the segments having a constant width and a constant length over each segment and wherein the respective lengths of each segment are selected to generate improved return loss data over a greater range of frequencies than that possible when a common length is shared by each segment.

8. The method of claim 7, wherein varying one or more characteristics of the transmission line comprises adjusting the width of the adjacent conductors forming the transmission line from the first end to the second end.

9. The method of claim 7, wherein varying one or more characteristics of the transmission line comprises arranging respective adjacent edges of the pair of conductors forming the transmission line such that a distance between the adjacent edges of the pair of conductors varies with distance along the transmission line.

10. A method for designing an integrated circuit assembly, comprising:
    identifying a range of frequencies that are desired for application to a transmission line, the transmission line comprising a pair of adjacent conductors having a first end and a second end opposed to the first end;
    identifying a first element designated for coupling to the first end of the transmission line;
    determining a desired impedance of the first element over the range of frequencies;
    identifying a second element designated for coupling to a second end of the transmission line;
    determining a desired impedance of the second element over the range of frequencies; and
    segmenting the transmission line to match the desired impedance of the first element and the desired impedance of the second element over the range of frequencies at both the first end and the second end of the transmission line, wherein segmenting comprises setting a constant width and a constant length for each segment and wherein the respective lengths of each segment are selected to generate improved return loss data over a greater range of frequencies than that possible when a common length is shared by each segment.

11. The method of claim 10, further comprising:
    arranging adjacent edges of the pair of conductors over each segment such that corresponding segments are separated by a common distance.

12. The method of claim 10, further comprising:
    arranging the pair of adjacent conductors such that a distance between respective centerlines of the adjacent conductors remains constant from a first segment to a second segment.

13. The method of claim 10, wherein the respective widths of each segment are selected to generate improved return loss data over a greater range of frequencies than that possible when a decreasing width is selected for each subsequent segment across a transmission line.

* * * * *